United States Patent [19]

Sprague et al.

[11] 4,107,701
[45] Aug. 15, 1978

[54] ACOUSTO-OPTIC SNAPSHOT RECORDER

[75] Inventors: Robert A. Sprague, Chelmsford; Alan J. MacGovern, Acton, both of Mass.

[73] Assignee: Itek Corporation, Lexington, Mass.

[21] Appl. No.: 723,878

[22] Filed: Sep. 16, 1976

[51] Int. Cl.² ............................................. G01D 9/00
[52] U.S. Cl. .................................... 346/108; 358/201
[58] Field of Search ................ 346/108, 76 L; 354/5; 358/201

[56] References Cited

U.S. PATENT DOCUMENTS

| | | | |
|---|---|---|---|
| 3,165,045 | 1/1965 | Troll | 354/5 |
| 4,000,493 | 12/1976 | Spaulding | 346/108 X |

Primary Examiner—Joseph W. Hartary

Attorney, Agent, or Firm—Homer O. Blair; Robert L. Nathans; Gerald H. Glanzman

[57] ABSTRACT

Apparatus for recording a serial line of electrical data as a spatial array of optical data. The apparatus employs an acousto-optic device through which the electrical signal to be recorded is passed as a continuous acoustic wave. The device is illuminated by a laser and imaged onto a recording medium to form an image of the acoustic wave passing through the device. By pulsing the laser just as the acoustic wave fills the device, a line of optical data can be recorded which will correspond to the acoustic wave in the device. By indexing the recording medium and reimaging every time a new acoustic wave just fills the device, an entire raster may be recorded.

5 Claims, 3 Drawing Figures

ACOUSTO-OPTIC SNAPSHOT RECORDER

BACKGROUND OF THE INVENTION

1. Field of the Invention

The present invention relates generally to an acoustooptic recording apparatus, and, more particularly, to a high speed, wide bandwidth optical system for reading out a serial electrical signal as parallel optical data.

2. Description of the Prior Art

High speed recorders for recording a serial line of electrical data as a spatial array of optical data are important in many fields. For example, in imaging applications, they are used to reproduce a picture or image that has been transmitted electrically over large distances. In addition, they are used in a wide variety of signal processing systems including systems for performing spectrum analysis.

One conventional prior art technique for high speed data recording is with the use of a laser scanner. In such systems, a laser beam is caused to scan across a recording medium by a suitable mechanical scanning apparatus such as a system of rotating mirrors or prisms. By turning the laser beam on and off or otherwise modulating it with the signal to be recorded as it is scanned across the recording medium, the data can be optically reproduced on the medium.

Such systems, being mechanical in nature, suffer from obvious limitations. For one thing, they are somewhat limited in scanning speed as the mirrors or prisms tend to distort at excessive speeds of rotation. Also, they have bearings and other mechanical components which eventually wear out. In addition, the scanning apparatus frequently must be maintained in a vacuum to eliminate air turbulence problems caused by the mirror rotation, and this makes the system unweildy and not very portable. Finally, it is essentially impossible to make each facet of the scanner exactly the same, and, as a result, as an array of lines are put down in a raster format, banding and line jitter will occur, at least to some extent.

More recently, the prior art has developed a solid state scanner which requires no moving parts and, therefore, does not suffer from many of the above-described inadequacies. Typically, these systems employ an acousto-optic cell to replace the rotating mirrors or prisms. Specifically, a laser beam is first appropriately modulated by the electrical signal to be spatially recorded and is then passed through the cell and focused to a point on the recording medium. A sinusoidal acoustic signal is also passed through the cell, and, as is understood in the art, this will cause the laser beam to be diffracted at a given angle. By then changing the acoustic signal frequency in a continuous manner, the laser beam will be scanned across the recording medium to form a line of points representative of the input electrical signal by which the beam is modulated. By indexing the recording medium, an entire raster or series of lines of data can be recorded.

This system, while having the advantage of being fully solid state, still suffers from several shortcomings. For one thing, it is, for practical purposes, limited in the number of spots that can be placed along a single line. Specifically, in such systems, there is a trade-off between the number of points that can be placed along a line and the scan rate (i.e., the so-called $\beta \tau$ product). For example, for a commercially available 100 megahertz bandwidth device, although 1,000 resolvable spots can be recorded at low data rates, only 500 spots can be recorded at 50 million spots per second, and only 2 resolvable spots can be recorded at 100 million spots per second. Also, in these systems, there is a loss in duty cycle due to the time required for the first acoustic signal to pass through the cell before the next signal can be sent. Further, the spot position accuracy obtainable with such systems are not as great as might be desired. Finally, the optical quality of the acousto-optic cells used in this type of system must be quite good or distortions will result.

SUMMARY OF THE PREFERRED EMBODIMENTS

In accordance with the present invention, a novel technique for recording a line of electrical data as a spatial array of optical data, is provided. The system, according to the preferred embodiment, also utilizes an acousto-optic cell, for example, a Bragg cell, and, thus, also has the advantages of solid state operation. However, in the present invention as distinguished from prior art systems, the electrical signal to be recorded, is fed directly into the acoustic cell via appropriate transducer means to produce an acoustic wave which can be directly imaged onto a recording medium via laser or other light. In other words, in the present invention, the cell itself is imaged onto the recording medium as a line of optical data corresponding to the line of acoustic signals in the cell at the moment of imaging.

This line of acoustic data will obviously move across the cell in a continuous fashion, however, by pulsing the illuminating light just when the cell is filled with a line of data, a single stationary line of optical data can be recorded on the recording medium as a stationary image. By vertically deflecting the line image, and by periodically pulsing the light just as a new line of acoustic data fills the cell, a series of lines of data can be recorded in a raster format.

Thus, in the present invention, the electrical signal to be recorded is passed through the cell as a corresponding acoustic wave, which, in turn, is imaged directly onto the recording medium. Such a technique provides several advantages over the prior art systems described above. For one thing, there will be essentially zero distortion in the recording because the travelling wave will always move through the cell at a constant speed of sound. Furthermore, the system can essentially operate with a 100% duty cycle if the light is pulsed exactly in correspondence with the fill time of the cell. Also, there will be no line banding problems as in rotating mirror systems because the recorded line will be an image of the acoustic cell. Further, line jitter can be very easily controlled because, in this system, it is determined only by the accuracy of the laser pulse which can be controlled very accurately. Finally, the present invention results in a true high speed, high data system, because it is not necessary to trade-off between the number of spots on a line and the scan rate. For example, using the same commercially available device described previously, 1,000 spots can be recorded on a line at a data rate of 100 million spots per second with no loss in duty cycle. Further details and advantages of the invention will be set forth in greater detail hereinafter.

DETAILED DESCRIPTION OF THE PREFERRED EMBODIMENTS

Figure 1:
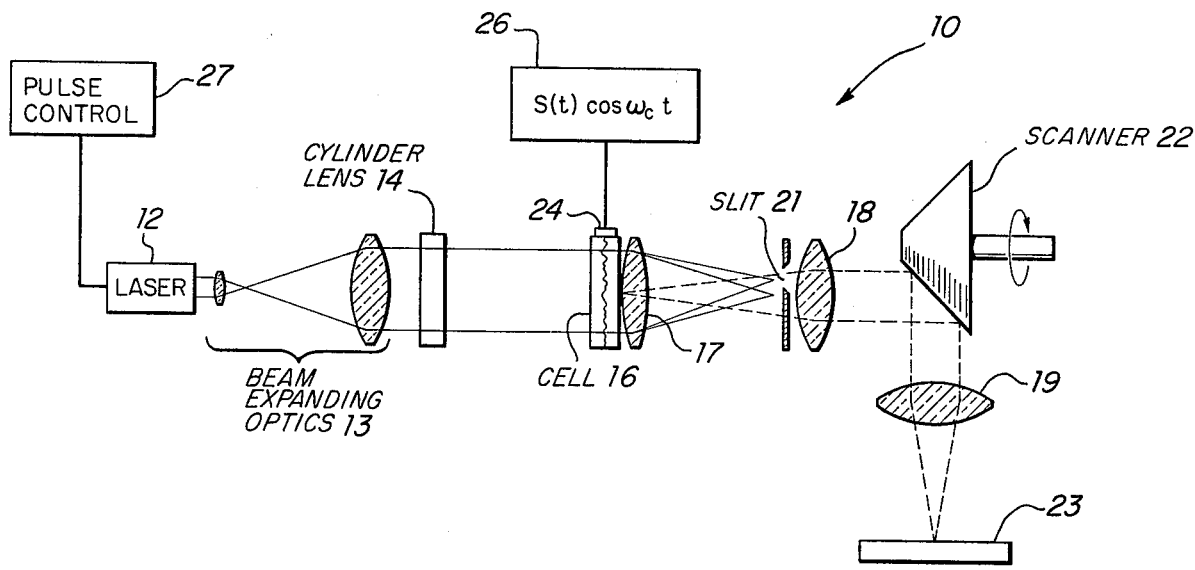
FIG. 1 schematically illustrates an acousto-optic snapshot recorder according to a presently most preferred embodiment of the invention.

FIG. 1 schematically illustrates an acousto-optic snapshot recorder according to a presently most preferred embodiment of the invention. The system is generally identified by reference number 10 and includes the following basic structure: a laser 12, beam expanding optics 13, cylindrical condenser lens 14, acousto-optic cell 16, imaging lenses 17, 18 and 19, demodulating slit 21, scanner 22 and recording medium 23.

The laser 12, which will be described in greater detail hereinafter, preferably comprises a pulsed laser such as a cavity-dumped, mode-locked argon laser or a Q switched frequency doubled Nd-Yag laser, and generates a narrow collimated beam which is expanded by optics 13 and condenser lens 14 so as to substantially fill acousto-optic cell 16. The cell 16 is of conventional type and may be constructed of any one of a variety of well-known materials such as lead molybdate or tellurium dioxide. A transducer 24 of, for example, lithium niobate, is epoxied or cold-well bonded to the cell 16 and is used to create a travelling acoustic wave which will propagate across the acousto-optic material to provide a travelling wave phase grating which will diffract the light entering from the side of the cell from laser 12. As is known in the art, light passing through the acousto-optic cell will be diffracted at an angle proportional to the frequency of the acoustic signal passed through the cell and the amount of energy present in the diffracted first order beam can be made quiite high. Furthermore, by feeding a multiple frequency acoustic signal into the device, a set of diffracted first order beams can be produced, each being proportional to a corresponding frequency.

In the present invention, the transducer is fed by a signal from input 26. Specifically, the signal to be recorded is used to amplitude modulate (or, alternatively, if desired, frequency modulate or phase modulate) a high frequency carrier signal, and this modulated signal is then used to drive the acousto-optic cell 16 via transducer 24. This signal, $S(t)\cos\omega_c t$, crosses the cell as a travelling wave phase variation, and is illuminated by light from laser 12. The light passing through the cell after being diffracted by the acoustic wave, is then imaged onto a recording medium 23 via imaging optics 17, 18 and 19. A demodulating slit 21 is placed in the Fourier transform of the cell and is centered on the carrier diffracted first order, such that the travelling wave phase variation will appear as an intensity variation on the recording medium with the intensity being proportional to the signal of interest with the carrier removed. In other words, the resultant image on the recording medium 23 will be a line of data points with the intensity of each point being proportional to the phase variations of the travelling wave in the acousto-optic cell at the time it is illuminated, which travelling acoustic wave will, in turn, be proportional to the inputted electrical signal of interest.

It should be recognized that the line of data will move across the recording medium in correspondence with the movement of the travelling wave across the cell. This motion can be stopped, however, to permit recording of a stationary line of data on the recording medium 23 by pulsing the laser with a very short pulse at the proper time. Specifically, by pulsing the laser 12 with pulse control electronics 27 just at the instant when the acoustic wave fills the cell, an entire line of optical data can be instantly recorded on medium 23. Vertical scanner 22, which, for example, may be a conventional polygonal mirror type scanner, is then actuated to translate the image of the signal down by one spacing during the transit time of the next set of data across the cell and the laser is again pulsed to record a second line of data. By continuing the process, an entire raster can be generated on the recording medium. By pulsing the laser exactly in correspondence with the fill time of the cell, substantially 100% duty cycle recording can be obtained.

In the design of the system, a relatively efficient acousto-optic cell is required. Two good materials are tellurium dioxide and lead molybdate. Assuming an efficiency of 70% with attenuation losses of 3bd across the cell, devices can be fabricated from these materials with bandwidths of 500 MHz or more.

In addition to the acousto-optic cell, the laser used must also meet fairly stringent requirements. It must have sufficiently short pulses to freeze the travelling wave (e.g., 2 nanoseconds), and a sufficient repetition rate (235,000 per second) to permit attainment of substantially 100% duty cycle operation. A cavity-dumped, mode-locked argon laser marketed by Spectra-Physics Inc., has been found to satisfy these requirements. As will be amplified hereinafter, however, techniques can be provided to relax these requirements to permit the use of less expensive lasers.

In general, with the present invention, many of the inadequacies of the prior art recorder systems have been obviated. For one thing, the scan rate will always be at the speed of sound in the acoustic cell so that there will be no scan distortion. Also, there will be no trade-off between the number of scan points and the scan rate as is found in the conventional prior art acousto-optic scanner described previously. With the present invention, the complete number of points accepted by the acoustic cell is always used, and the data rate will only be limited by the frequency properties of the acoustic materials. In signal processing, recording rates of 150 megacycles (or 300 megapixels/second in the case of image recording) is clearly possible with greater rates being contemplated.

Figure 2:
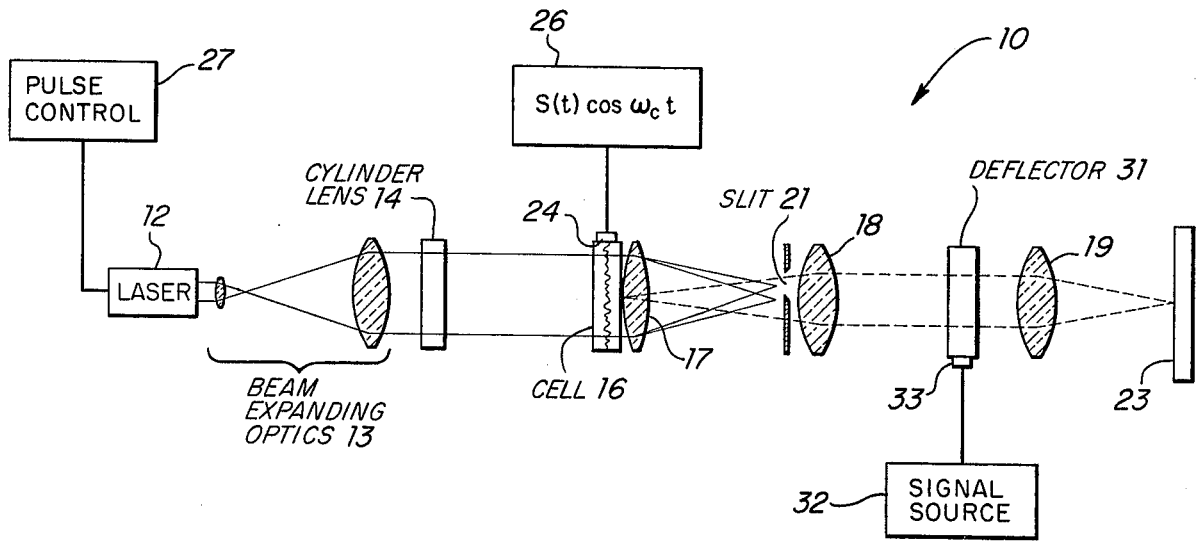
FIG. 2 schematically illustrates an alternative embodiment of the invention to permit relaxation of the laser specifications.

FIG. 2 illustrates an alternative embodiment of the invention. Specifically, in the FIG. 1 embodiment, a laser is required which will give extremely fast pulses with enough energy and a high enough repetition rate to freeze each line of travelling data. Although as described above, lasers are available to do this, they are quite expensive, and, accordingly, it is desirable to provide a means for relaxing the requirements on the laser pulse width. It is toward this goal that the embodiment of FIG. 2 is directed.

Specifically, in FIG. 1, it should be recalled that as the input acoustic signal moves through the acousto-optic cell as a travelling wave, the resultant image of the cell will move across the imaging medium in a similar manner. Accordingly, to freeze the image on the medium, a very fast pulse is required from the laser at the precise instant that a line of data just fills the cell. The system of FIG. 2 relaxes this precision by compensating for the image motion of the travelling wave by deflecting the image in the opposite direction with an acousto-optic deflector. Specifically, in FIG. 2, an acousto-optic deflector 31 is positioned in the path of the output of the cell 16. As is known in the art, a continuous signal which changes linearly with time is passed through the deflector from source 32 via transducer 33 so as to just compensate for the motion of the travelling wave passing through cell 16 such that the output from deflector 31 will be a stationary image which can be recorded on imaging medium 23 via lens 19 (the scanner has been omitted from this FIG. for clarity).

Figure 3:
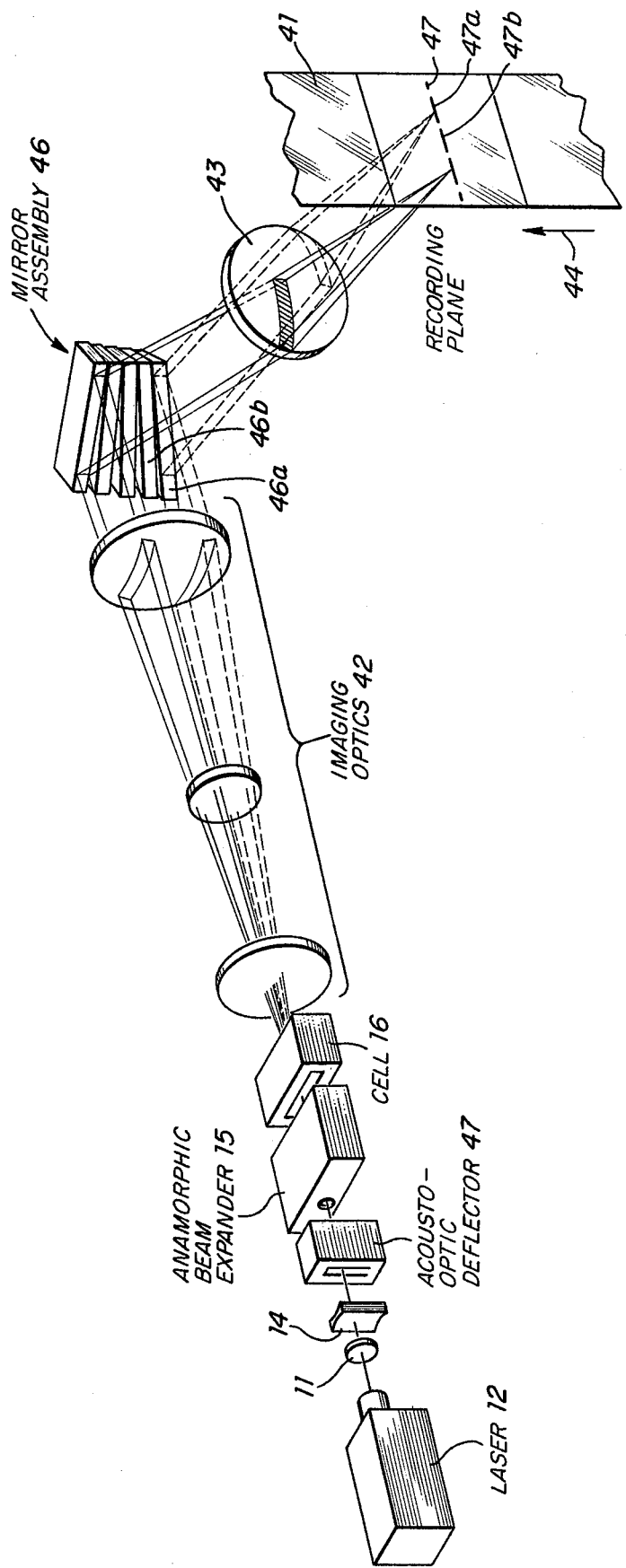
FIG. 3 schematically illustrates a second alternative embodiment to permit an increase in the number of resolvable spots recorded along a line.

As mentioned above, the acousto-optic recording apparatus of the present invention can readily record a line of data having, for example, 1,000 resolvable spots at high data rates. By employing the slightly modified setup illustrated in FIG. 3, however, the number of resolvable spots along a single line can be made even larger. In the embodiment shown in FIG. 3, light from laser 12 is directed through acousto-optic cell 16 via appropriate optics including lens 11, cylindrical condenser lens 14 and anamorphic beam expander 15. Also, and as before, cell 16 is fed by the serial electrical signal to be recorded via appropriate transducer means (not shown in FIG. 3). The image of the acoustic wave is thereafter imaged onto recording plane 41 via appropriate imaging optics 42 and 43. In FIG. 3, the imaging plane comprises a film recording system which moves a strip of film in the direction indicated by arrow 44 to record consecutive lines of data thereon. acousto-optic film recording system is interchangeable with and may be used instead of the stationary recording plane and scanner arrangement illustrated in FIGS. 1 and 2, if desired.

Also illustrated in FIG. 3 is a mirror assembly 46 positioned to receive the image from cell 16 and reflect it onto the film 41. Specifically, the mirror assembly 46 comprises a plurality of mirrors 46a, 46b, etc., five being shown, with each being aligned to direct the light to a different location on the film and more particularly, to a different position along a line, e.g., line 47 on the film. Also, in the system is an acoustooptic deflector 47 of conventional type to direct the laser beam light through the acousto-optic cell 16 at the proper orientation to impinge upon one or another of the mirrors 46a, 46b, etc.

The system operates as follows. When the acousto-optic cell 16 is just filled with a set of data, the laser will be pulsed as before. Also, deflector 47 will be driven to direct the image of the cell 16 onto mirror 46a which, in turn, will direct the image to position 47a along line 47. When the next group of data fills the cell 16, and laser 12 is again pulsed, deflector 47 will direct that image onto the film via mirror 46b onto location 47b of the film. This is continued through the entire mirror assembly and, in this way, a single long line of 10,000 or more data points can be recorded on film 41.

Although five mirrors are shown in the FIG., a larger number can obviously be used if desired. Also, if preferred, the mirror assembly could be replaced by an appropriate wedge assembly.

While what has been described above are the presently most preferred embodiments of the invention, it should be understood that many additions and modifications could be made if desired. For one thing, the systems described could be utilized in a wide variety of different applications. They may, for example, be used merely as image recorders. Alternatively, they could be used in optical data processing applications, for spectrum analysis or the like. Because many additions, modifications or omissions can be made, it should be clearly understood that the invention should be limited only insofar as required by the scope of the following claims.

What is claimed is:

1. Acousto-optic recording apparatus for reading out a serial electrical signal as spatial optical data comprising:
    A. acousto-optic means;
    B. means for passing a continuous travelling acoustic wave through said acousto-optic means, said acoustic wave being proportional to said serial electrical signal;
    C. a recording medium;
    D. imaging means for imaging said acoustic wave on said recording medium, said imaging means including:
        a. light source means for illuminating said acousto-optic means;
        b. optical means for imaging the light from said acousto-optic means onto said recording medium; and,
        c. means for "stopping" the motion of said travelling acoustic wave passing through said acousto-optic means for recording a stationary line of optical data on said recording medium proportional to the acoustic wave within said acousto-optic means; and,
    E. means for recording a plurality of said lines of optical data along one long line on said recording medium, including:
        a. a plurality of optical deflector means in the path of the light from said acousto-optic means to direct images to different locations on said recording medium; and
        b. an acousto-optic deflector for directing light from said acousto-optic means to consecutive ones of said plurality of optical deflector means for recording a plurality of said lines of optical data along one long line on said recording medium.

2. Apparatus as recited in claim 1 wherein said plurality of optical deflector means comprises a plurality of mirrors.

3. Apparatus as recited in claim 1 wherein said means for "stopping" the motion of said travelling acoustic wave comprises a second acousto-optic deflector in the path of the light from said acousto-optic means for compensating for the motion of said acoustic wave passing through said acousto-optic means such that the output of said second deflector will be a stationary image for imaging on said recording medium.

4. Apparatus as recited in claim 1 wherein said light source means comprises a laser.

5. Apparatus as recited in claim 4 wherein said laser comprises a cavity-dumped, mode-locked argon laser.

* * * * *